United States Patent [19]

Christopher

[11] Patent Number: 4,731,851
[45] Date of Patent: Mar. 15, 1988

[54] DIGITAL SIGNAL GAIN CONTROL CIRCUITRY FOR VARYING DIGITAL SIGNALS IN SUBSTANTIALLY EQUAL DB STEPS

[75] Inventor: Todd J. Christopher, Indianapolis, Ind.

[73] Assignee: RCA Corporation, Princeton, N.J.

[21] Appl. No.: 910,993

[22] Filed: Sep. 24, 1986

[51] Int. Cl.$^4$ .......................................... H03G 3/00
[52] U.S. Cl. .................................. 381/104; 330/284; 455/232
[58] Field of Search ............... 328/168; 455/355, 232; 381/104, 105, 109; 364/571; 330/284, 144, 145, 129

[56] References Cited

U.S. PATENT DOCUMENTS

| | | | |
|---|---|---|---|
| 3,959,639 | 5/1976 | Köethmann | 235/164 |
| 4,004,140 | 1/1977 | Izumi et al. | 235/152 |
| 4,270,177 | 5/1981 | Endoh | 364/571 |
| 4,287,805 | 9/1981 | Gross | 84/1.26 |
| 4,390,834 | 6/1983 | Ohshita | 179/1 VL |
| 4,447,826 | 5/1984 | Lewis et al. | 358/27 |

FOREIGN PATENT DOCUMENTS 2035732 6/1980 United Kingdom .

Primary Examiner—Forester W. Isen
Attorney, Agent, or Firm—E. M. Whitacre; P. J. Rasmussen; E. P. Herrmann

[57] ABSTRACT

A volume control or amplitude varying system for digital signals includes a cascade connection of a coarse multiplier/divider for changing the values of digital signals in 6 db steps and a fine multiplier/divider for changing the values of digital values logarithmically in substantially equal steps of less than 6 db per step. The coarse multiplier/divider selectively multiplies the digital signal by powers of 2. The fine multiplier/divider multiplies the digital signal by predetermined values, an ascending/descending sequence of which form a substantially logarithmic sequence. Both serial-bit and parallel-bit embodiments are described.

17 Claims, 6 Drawing Figures

DIGITAL SIGNAL GAIN CONTROL CIRCUITRY FOR VARYING DIGITAL SIGNALS IN SUBSTANTIALLY EQUAL DB STEPS

This invention relates to volume control in a digital audio signal reproduction system.

Developments in digital processing circuitry have made practical consumer digital audio systems. Digital audio systems are desirable because of their inherent parametric stability, high signal-to-noise qualities and reduced parts count.

The input and output of digital audio systems are analog. At the input end of the digital system the analog sound signal is converted to digital representations of the analog signal and at the output end the processed digital representations are reconverted to analog form for application to speakers. It is desirable that volume control of the audio signal be performed in the digital domain to eliminate noise associated with analog control potentiometers and analog switched gain elements. In addition, using large scale integrated circuitry, an entire digital audio processing system, including volume control can be fabricated on a single integrated circuit, and all control functions can easily be effected from, for example, a remote transmitter.

The human ear has a substantially logarithmic sensitivity to variations in sound. Thus, one aspect of the invention is to provide digital volume control in substantially logarithmic steps.

SUMMARY OF THE INVENTION

The present invention is volume control circuitry for logarithmically amplifying/attenuating digital audio signals. The volume control circuitry includes a coarse gain/attenuation circuit for altering the values of digital audio signals by powers of two. Serially coupled to the coarse gain/attenuation circuitry is further circuitry for selectively multiplying the processed audio signals by predetermined values. The predetermined values are selected so that an ascending/descending sequence of such values is substantially logarithmic.

DETAILED DESCRIPTION

Volume control of digital audio signals may be accomplished by amplifying or attenuating the digital audio samples. However, it is preferable to attenuate the samples for the following reasons. Typical digital audio systems start with fourteen or sixteen bit samples in order to realize the desired dynamic range and signal to noise ratio. As the digital audio samples are processed in the digital system the sample bit-width tends to expand, to, for example, twenty bits. Consider that the 20-bit digital audio samples are to be subjected to 60 dB of volume control by amplification. This implies multiplying the samples by values from zero to 1000, and thereby increasing the maximum bit width of the 20-bit audio samples to thirty bits. If a conventional resistor ladder tree or current summing digital-to-analog converter is employed to convert the digital audio samples to the analog domain, the extra ten bits added by volume control makes the converter significantly more complicated.

Conversely if volume control is accomplished by attenuation, the maximum bit width of the processed samples remains constant at e.g. 20-bits requiring a significantly less complicated digital-to-analog converter.

It should be appreciated, however, that non-conventional digital-to-analog conversion techniques, such as pulse width modulated converters may not be complicated by extended bit widths, thus, both amplifying and attenuating volume control systems will be described.

Figure 1:
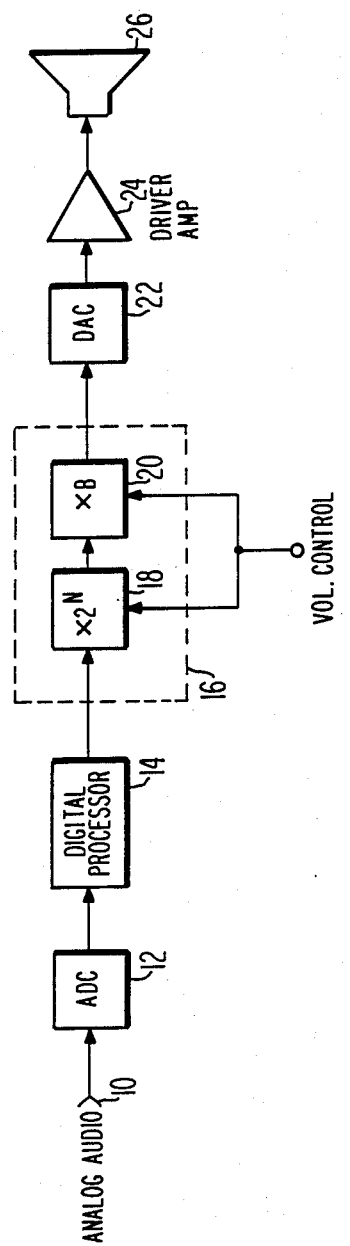
FIG. 1 is a block diagram of a digital audio system including a digital volume control system embodying the invention.

Referring to FIG. 1, a representative digital audio processing system is shown including a digital volume control element. In FIG. 1, analog audio signal on connection 10, from, for example, an antenna and tuner is applied to the analog input terminal of an analog-to-digital converter (ADC) 12. ADC 12 develops pulse code modulated (PCM) representations of the analog signal at uniformly spaced time intervals and at a rate which satisfies the Nyquist sampling criterion. The PCM audio samples from ADC 12 are applied to a digital processor 14 wherein the PCM audio signal may be filtered, expanded and noise reduced or otherwise conditioned for reproduction in, for example, a speaker system.

The processed PCM audio signal from processor 14 is applied to a volume control circuit 16 which logarithmically changes the values of the PCM samples to effect amplification or attenuation of the signal. The signal from volume control circuit 16 is coupled to a digital-to-analog converter (DAC) 22 which converts the PCM audio signal to analog form. The analog signal from DAC 22 is coupled to a speaker 26 via a driver amplifier 24.

The volume control circuit 16 includes a coarse multiplier/divider 18 and a fine multiplier/divider 20. The coarse multiplier/divider 18 multiplies the applied samples by factors of $2^N$ where N represents integer values which may be positive or negative. For positive values of N, the PCM signal is multiplied by powers of two and for negative values, the PCM signal is divided by powers of two. If the value of N is incremented in unit steps the PCM signal is multiplied/divided to effect a 6 dB change per step.

The fine multiplier/divider 20 multiplies the output of the coarse multiplier/divider by a sequence of, for example, three or four numbers, which ascend/descend substantially logarithmically. If the desired volume change per step is approximately 1.5 dB the sequence of numbers, $B_i$, may be 16, 19 23 and 27.

If the value of the signal applied to the volume control element 16 is S, the output, $O_S$, produced by element 16 in dB is $$O_S = 20 \log_{10}(S \times 2^N \times B_i) \tag{1}$$

$$= 20 \log_{10}(S) + 20 \log_{10}(2^N \times B_i). \tag{2}$$

For a particular signal of amplitude S, changes in amplitude are governed by the term $20 \log_{10}(2^N \times B_i)$. Amplitude changes for $N = -1, 0, +1$ and 2 and $B_i$ 16, 19, 23 and 27 are tabulated in Table I.

TABLE I

| N | $B_i$ | $20 \log_{10}(2^N \times B_i)$ | Step dB |
|---|---|---|---|
| −1 | 16 | 18.062 | |
| −1 | 19 | 19.554 | 1.49 |
| −1 | 23 | 21.214 | 1.66 |
| −1 | 27 | 22.607 | 1.39 |
| 0 | 16 | 24.082 | 1.48 |
| 0 | 19 | 25.575 | 1.49 |
| 0 | 23 | 27.235 | 1.66 |
| 0 | 27 | 28.627 | 1.39 |
| 1 | 16 | 30.103 | 1.48 |
| 1 | 19 | 31.569 | 1.49 |
| 1 | 23 | 33.255 | 1.66 |
| 1 | 27 | 34.648 | 1.39 |
| 2 | 16 | 36.124 | 1.48 |
| 2 | 19 | 37.616 | 1.49 |
| 2 | 23 | 39.276 | 1.66 |
| 2 | 27 | 40.668 | 1.39 |

From Table I it is seen that the gain increment between recurring values of $B_i$ or for a set of values $B_i$ is approximately 6 dB. The increment or step between successive values of $B_i$ is approximately 1.5 dB and this value corresponds to the 6 dB per set of values $B_i$ divided by four, the number of values $B_i$ in the set. The gain increment per step corresponds to the difference between values $B_i$ or in dB corresponds to $20 \log_{10}(B_{i+1}) - 20 \log_{10}(B_i)$ which may be simplified to $20 \log_{10}(B_{i+1}/B_i)$. Thus, for the set of four values of $B_i$ illustrated in Table I calculations will show that 6 dB/4 approximates $20 \log_{10}(B_{i+1}/B_i)$dB or more generally for any set of values of $B_i$ including P values per set (P an integer), if the gain step size is to be in substantially equal dB increments, then $20 \log_{10}(B_{i+1}/B_i)$ must approximate 6 dB/P. Taking the antilog, the ratio, $B_{i+1}/B_i$, of successive values of $B_i$ must be substantially equal to $10^{(6/20P)}$.

A gain control system with approximately 2 dB steps may be implemented with a fine multiplier/divider which iterates the set of three factors $B_i$ equal to 16, 20 and 25.

Figure 2:
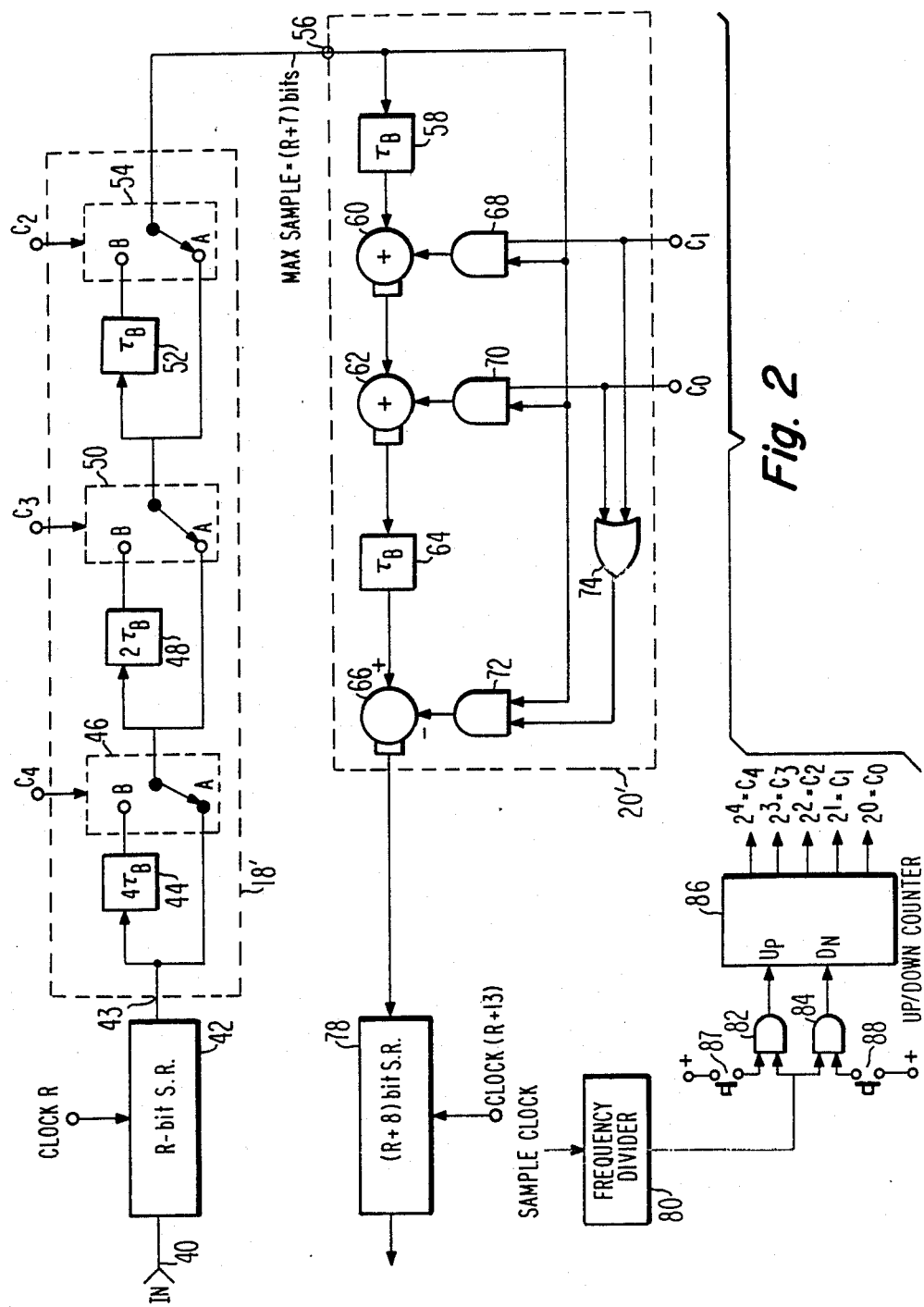
FIGS. 2, 4 and 5 are partial block - partial logic schematic diagrams of serial-bit digital volume control systems embodying the invention.

FIG. 2 illustrates a particular serial-bit volume control circuit. This circuit will be described with reference to the waveforms illustrated in FIG. 3. It is assumed that the serial-bit PCM samples ar R-bit wide binary samples, with the least significant bit (LSB) occurring first in time. The samples occur at a rate defined by the waveform designated SAMPLE CL in FIG. 3, which for high fidelity audio signals should be at least 44 KHz. The sample bit rate is defined by the waveform designated SYSTEM CL.

In FIG. 2, samples from, for example the digital processor, are applied via connection 40 to an R-bit serial shift register 42. The samples are clocked into the register 42 under the control of CLOCK R having R pulses per sample period (shown as waveform CLOCK R in FIG. 3). At the beginning of each sample period, the sample in register 42 is serially clocked out on connection 43, LSB first and a subsequent sample is loaded into the register. The samples from register 42 are coupled to the coarse multiplier/divider 18'.

The input of multiplier/divider 18' is directly connected to one input terminal (designated A) of a multiplexer 46 and to a second terminal (designated B) of multiplexer 46 via a delay element 44. Delay element 44 delays samples by four sample bit rate periods and multiplexer 46 is controlled by a control signal C4.

The output of multiplexer 46 is directly coupled to input terminal A of multiplexer 50 and coupled to input terminal B of multiplexer 50 via delay element 48. Delay element 48 delays samples by two sample bit rate periods and multiplexer 50 is controlled by a control signal C3.

The output of multiplexer 50 is directly coupled to the input terminal A of multiplexer 54 and coupled to the input terminal B of multiplexer 54 via delay element 52. Delay element 52 delays samples by a one sample bit rate period and multiplexer 54 is controlled by a control signal C2.

For illustrative purposes assume that the control signals C2, C3 and C4 are each bilevel signals exhibiting logic high and logic low states. For the control signal exhibiting a logic low state, the respective multiplexer couples its output terminal to its A input terminal, and for a logic high state the respective multiplexer couples its output terminal to its B input terminal. If the control signals C2, C3 and C4 are concatenated to form the control signal C2C3C4, this signal can exhibit eight binary states representing the decimal numbers 0–7. For the concatenated control signal binary states represented by the numbers 0–7 the multiplier/divider 18' provides sample delays of 0–7 sample bit rate periods.

Delaying a serial-bit signal by N sample bit rate periods shifts all of the sample bits to N more significant bit positions. Shifting a serial-bit sample to N more significant bit positions effects a multiplication of the sample by $2^N$. Thus, sequencing the control signals through the states representing the numbers 0–7 multiplies the applied samples by the factors 1, 2, 4, 8, 16, 32, 64, 128. Additional stages may be added to the multiplier/divider 18' to provide larger binary gain factors. In dB the gain, G, of multiplier/divider 18' is given by $$G = 20 \log_{10}(2^N) = N20 \log_{10}(2). \tag{3}$$

If N is incremented by one unit, the gain is given by $$G = (N+1)20 \log_{10}(2). \tag{4}$$

The gain increment or step is thus $20 \log_{10}(2) = 6$ dB.

The output from multiplexer 54 is coupled to the input terminal 56 of the fine multiplier/divider 20'. Multiplier/divider 20' includes the cascade connection of delay element 58, full adder 60, full adder 62, delay element 64 and subtracter 66. Each of the elements 58–66 impose a one sample bit rate period of delay to applied samples. The adders and subtracter are assumed to have an inherent processing delay period of one sample bit rate period. A second input to adder 60 is coupled to the input terminal 56 by an AND gate 68 which is controlled by a control signal C1. A second input to adder 62 is coupled to the input terminal 56 by an AND gate 70 which is controlled by a control signal $C_0$. The subtrahend input terminal of subtracter 66 is coupled to input terminal 56 through an AND gate 72. AND gate 72 is controlled by the logically ORed signals $C_0$ and $C_1$ provided by OR gate 74.

Figure 3:
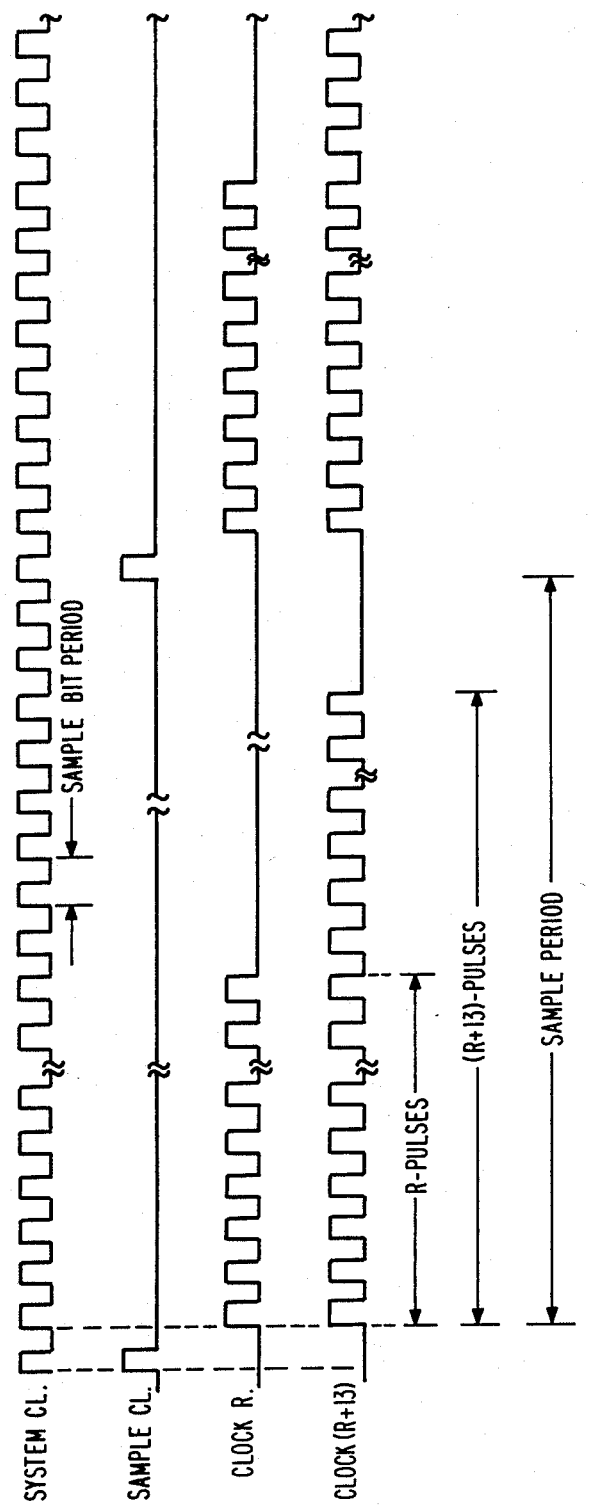
FIG. 3 is a timing diagram useful in describing the serial-bit systems of FIGS. 2, 4 and 5.

The output of subtracter 66 is coupled to the (R+8)-bit shift register 78 which is clocked by a clock having (R+13)-bit rate pulses (waveform CLOCK (R+13) in FIG. 3). Register 78 has R+8 bits or stages to accommodate the product of the sample times the multiplier.

Coarse multiplier/divider 18' contributes 7 bits to the R-bit sample, that is, the product of an R-bit sample and a 7-bit multiplier is an (R+7)-bit sample. Fine multiplier/divider 20' imposes a minimum delay of 5 sample bit periods to the coarse product which, if uncompensated, causes the volume control system to have a minimum gain factor of 32. In order to normalize the minimum gain factor to a value of one, the samples are clocked into register 78 with an extra five clock pulses to effect a division by 32. The maximum gain factor available from multiplier/divider 20' will be shown to be (2×27) or 54, which, when divided by 32, is 27/16. This factor adds one bit to the product, bringing the total number of bits in the product to (R+8). Thus, register 78 contains (R+8) bit positions and is clocked with a clock of R+13 pulses.

AND gates 68, 70 and 72 are disabled when $C_0$ and $C_1$ exhibit a logic low state. AND gates 72 and 70 couple the coarse product on input terminal 56 to subtracter 66 and adder 62 respectively when control signal $C_0$ exhibits a logic high state. AND gates 72 and 68 couple the coarse product on input terminal 56 to subtracter 66 and adder 60 respectively whenever control $C_1$ exhibits a logic high state.

Consider $C_0$ and $C_1$ both to be exhibiting a logic low state. In this condition, the coarse product from terminal 56 is passed through the cascade connection of elements 58-66 delayed by five bit periods but otherwise unaltered, thus, the coarse product is multiplied by 32 (and subsequently divided by 32 when clocked into register 78).

Next, consider $C_0$ to be high and $C_1$ low. The coarse product is coupled to one input of adder 62 and the coarse product delayed by two bit periods (multiplied by four) is coupled to the other input of adder 62 through adder 60 and delay element 58. The internal sum of adder 62 is (4+1) times the coarse product. This partial product is delayed two bit periods (multiplied by four) by the inherent delay in adder 62 and the delay of element 64 and coupled to the minuend input of subtracter 66. The coarse product is coupled to the subtrahend input of subtracter 66 which generates the difference of [4(4+1)−1] times the coarse product or 19 times the coarse product. This sample undergoes one bit period delay in subtractor 66 which effectively doubles the product to 38 times the coarse product.

Now consider control signals C0 low and C1 high. In this condition the coarse product is coupled to one input of adder 60 via AND gate 68, and the coarse product delayed by one bit period (multiplied by 2) via delay element 58 is coupled to the other input of adder 60 which develops the sum (2+1) times the coarse product. This sample undergoes a three sample bit period delay (multiplied by 8) in elements 60-64 and is coupled as the minuend to subtracter 66. The coarse product is coupled as subtrahend to subtracter 66 via AND gate 72. Subtracter 66 develops the difference of [8(2+1)−1] times the coarse product or 23 times the coarse product. The inherent delay of subtracter 66 doubles this product to 46 times the coarse product.

Finally, when both C0 and C1 are high the coarse product is coupled to the subtrahend input of subtracter 66 and to inputs of adders 62 and 60. The output (2+1) times the coarse product from adder 60 is delayed one bit period (multiplied by 2) and coupled to the second input of adder 62 which produces the sample [2(2+1)+1] times the coarse product or 7 times the coarse product. This sample is delayed two sample bit periods (multiplied by 4) and coupled to the minuend input of subtracter 66 which develops the difference (28−1) or 27 times the coarse product. This value is doubled by the inherent delay of subtracter 66 to a value of 54 times the coarse product.

Consider the control signal C4C3C2C1C0 formed by concatenating the signals C4, C3, C2, C1 and C0. This combination can represent $2^5$ or 32 states from 0–31. For the control signal C4C3C2C1C0 exhibiting the binary state 00000, the system exhibits 0 db gain. For this control signal exhibiting the binary state 11111, the system exhibits $20 \log_{10}(54/32) + 20 \log_{10}(128) = 46.69$ dB of gain. In between these extremes, if the binary value representing the control signal C4C3C2C1C0 is incremented in unit steps the gain factor changes in approximately 1.5 dB steps.

In FIG. 2, circuitry which may be implemented to generate such binary representative control signals C0–C4 includes a binary up/down counter having parallel binary output terminals $2^0$–$2^4$. These output terminals are connected to the control signal terminals C0–C4 respectively. The rate of volume control change should desirably be around three steps per second. The sample clock is divided down in divider 80 to generate an approximately 3 Hz clock signal which is coupled to respective first input terminals of AND gates 82 and 84. AND gates 82 and 84 are selectively exclusively enabled by switches 87 and 88 respectively, to couple the 3 Hz clock signal from divider 80 to either the up-clock input of the up/down counter to increase system gain or to the down-clock input of the up/down counter to decrease system gain. It may also be desirable to have the divider 80 programmable so that the rate of volume control change can be controlled. One instance where a relatively fast rate of step changes may be utilized is in turning the audio system off. In this instance, the gain is rapidly reduced to a minimum prior to switching the system off to preclude a loud click or pop.

The system of FIG. 2 may be slightly reconfigured to primarily provide signal attenuation. In this reconfiguration, register 78 is provided with R-bit positions or stages and is clocked with a clock signal having (R+12) pulses per sample period. The resulting product resident in register 78 at the end of the sample period is equal to the product of the sample times the coarse and fine multiplying factors divided by $2^{12}$. Thus, for a concatenated control signal C4C3C2C1C0 represented by the binary value 00000 the gain factor is $2^5$ (the minimum gain of the fine gain multiplier/divider 20') times $2^{-12}$ which equals $2^{-7}$ or −42.14 db. The maximum gain provided by the system for the control signal C4C3C2C1C0 represented by the binary value 11111 is $2^7$ (maximum coarse gain) times 2(27) (maximum fine gain) times $2^{-12}$ or +4.54 dB.

It will be appreciated by those skilled in the art of digital signal processing that the shift registers 42 and 78 in the FIG. 2 embodiments may be incorporated in, for example, the digital processor 14 and the DAC 22. In fact, register 42 may be totally eliminated depending on the source of samples provided to the volume control circuit. If it is not important to normalize the gain factors in the first embodiment described with reference to FIG. 2, then the maximum gain of the system is 2×27×128 or 6912. The number of binary bits required to represent this factor is 13. Thus, register 78 will be configured with (R+13) bit positions and will be clocked with bursts of (R+13) clock pulses per sample period.

Figure 4:
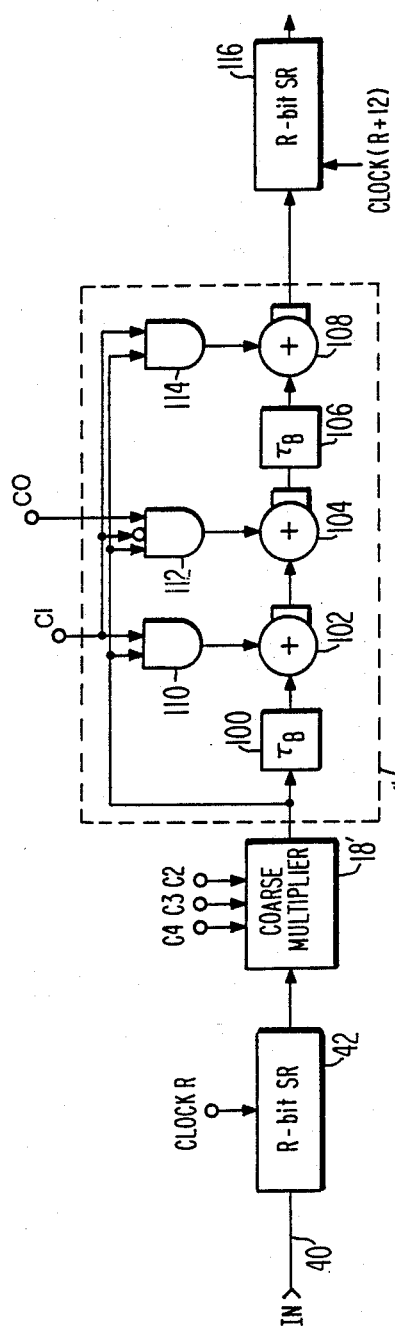

FIG. 4 is a serial-bit digital volume control system which provides attenuation in approximately 2 db steps. Elements designated with like numerals to elements in FIG. 2 are like elements. The fine multiplier/divider 20" is arranged to multiply the coarse product from the coarse multiplier/divider 18' by the factors 2(16), 2(20) and 2(25). The factor 2 in each of the gain factors results from the inherent delay provided by adder 108. The output of fine multiplier/divider 20" is coupled to an R-bit shift register clocked by bursts of (R+12) clock pulses, thus, the FIG. 4 system is configured to divide the products from element 18', 20' by $2^{-12}$.

Multiplier/divider 20" includes the cascade connection of delay element 100, adder 102, adder 104, delay element 106 and adder 108, each of which imposes a delay of one sample bit period. AND gate 110, controlled by control signal C1, couples the coarse product to a second input of adder 102 when control signal C1 is a logic high. AND gate 112, controlled by control signals C1 and C0, couples the coarse product to a second input terminal of adder 104 only on the condition that C1 is a logic low and C0 a logic high. AND gate 114, controlled by control signal C1, couples the coarse product to a second input terminal of adder 108 when C1 is a logic high.

For control signals, C0 and C1 both low, the coarse product passes through elements 100–108 delayed by five bit periods (multiplied by $2^5$) but is otherwise unaltered. The gain factor of the fine multiplier/divider 20" for the control signal C1C0 (control signals C1 and C0 concatenated) represented by the binary value 00 is 2(16) or 30.10 dB. If C0 is high and C1 low, i.e. C1C0=01, adder 104 is conditioned to sum the coarse product supplied via AND gate 112 with 4 times the coarse product supplied via adder 102 and delay element 100 and develop the sum of 5 times the coarse product. This sum is delayed 3-bit periods (multiplied by 8) in adder 104, delay element 106 and adder 108.

The value provided by adder 108 is (8×5) times the coarse product. Therefore, the fine gain for the control signal C1C0 represented by the binary value 01 is 32.04 dB which is 1.94 dB greater than for the control signal C1C0 represented by the binary value 00.

If C0 is low and C1 is high, adder 102 is conditioned to sum the coarse product coupled via AND gate 110 with twice the coarse product coupled via delay element 100, to provide the sum of 3 times the coarse product. This sum is delayed in adder 102, adder 104, delay element 106 (multiplied by 8) and summed with the coarse product in adder 108 to produce the sum of (24+1) times the coarse product. This sample is doubled by virtue of the delay in adder 108 to produce the product of 2(25) times the coarse product. Therefore, for the control signal C1C0 represented by the binary value 10, the fine gain factor is 50 or 33.99 dB which is 1.94 dB greater than for the control signal C1C0 represented by the binary value 01.

For control signals C1 and C0 both high, the gain factor remains the same as for C1 high and C0 low. Thus, for control signal C4C3C2 represented by the binary value 000 and control signal C1C0 represented by the binary values 00, 01, 10 and 11, the total system gain is −42.15 dB, −40.21 dB, −38.26 dB and −38.26 dB respectively, due to the division by $2^{12}$ effected by the extra 12 clock pulses applied to register 116. The maximum system gain occurs for the control signal C4C3C2C1C0 represented by the binary value 11111 and is −38.26 dB+20 log$2^7$=3.88 dB, and 0 dB gain occurs for the control signal C4C3C2C1C0 represented by the binary value 11100.

The control signals may be generated with apparatus similar to the apparatus illustrated in FIG. 2. Alternatively, the control signals may be provided by, for example, a microprocessor used to control the audio reproduction system.

The multiplier/divider 20" is seen to change the gain/attenuation in approximately 2 dB steps for binary increments of the control signal C1C0. Similarly the total gain changes in 2 dB steps for binary increments of the control signal C4C3C2C1C0 represented in binary format if the states for control signal C1C0 equal to 11 are excluded.

Figure 5:
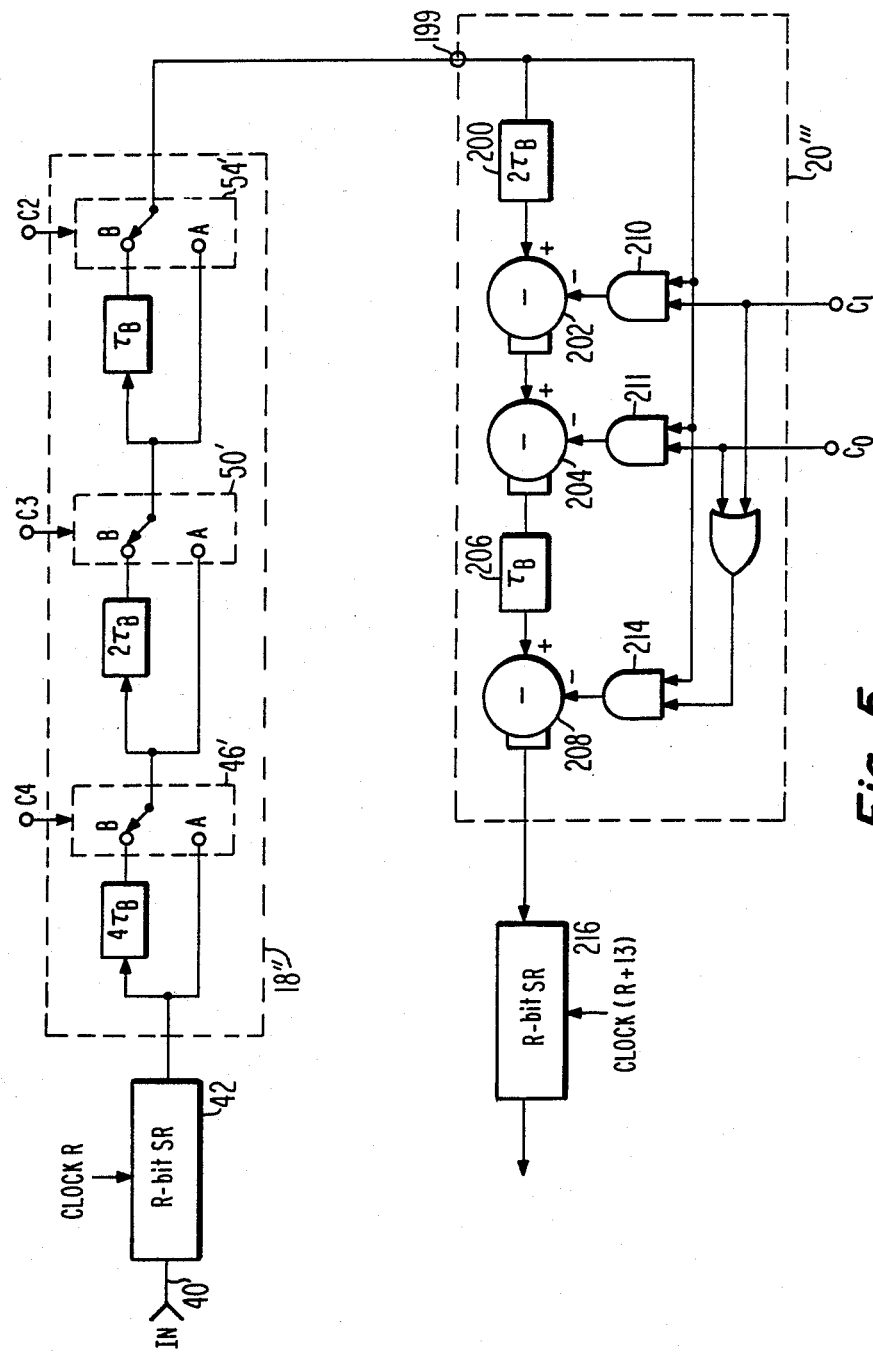

FIG. 5 is an amplitude control system which provides attenuation in approximately 1.5 dB steps wherein the gain factor for the control signal C4C3C2C1C0 represented by the binary value 00000 is zero dB and the gain factor for the control signal C4C3C2C1C0 represented by the binary value 11111 is −42.14 dB. In FIG. 5 the coarse multiplier/divider 18''' is similar to the coarse multiplier/divider 18' shown in FIG. 2 with the exception that for control signal values C4, C3 and C2 equal to logic zeroes the multiplexor 46', 50' and 54' couple their respective output terminals to their respective B input terminals. Thus, for the control signal C4C3C2 (formed by concatenating control signals C4, C3 and C2) represented by the binary values 000, 001, 010. . . 111, the gain factors of the coarse multiplier/divider 18'' are $2^7$, $2^6$, $2^5$ . . . $2^0$ respectively.

The fine multiplier/divider 20''' is arranged to multiply samples applied thereto by the factors 64, 54, 46 and 38 for the control signal C1C0 (formed by concatenating control signals C1 and C0) represented by the binary values 00, 01, 10 and 11 respectively. This arrangement includes the cascade connection of a 2-sample bit delay element 200, a subtracter 202, a subtracter 204, a 1-sample bit delay element 206, and a third subtracter 208. The minuend input terminals of the subtracters are connected in the cascade connection. The subtrahend input terminal of subtracter 208 is coupled to the input terminal 199 of the fine multiplier/divider via AND gate 214 when either control signal C0 or C1 is high. The subtrahend input terminal of subtracter 202 is coupled to input terminal 199 via AND gate 210 only when control signal C1 is high, and the subtrahend input terminal of subtracter 204 is coupled to input terminal 199 via AND gate 211 only when control signal C0 is high.

When both control signals C1 and C0 are low, samples applied to the fine multiplier/divider 20''' are delayed by 6 sample-bit periods but are otherwise unaltered. Thus, for the control signal C1C0=00, the gain factor of the fine multiplier/divider is 64 or $2^6$, and for the concatenated control signal C4C3C2C1C0 represented by the binary value 00000, the total gain of the coarse and fine multiplier/divider combination is 2×64 or $2^{13}$. In order to normalize this gain factor to 1, that is 0 dB, the output of the fine multiplier/divider 216 is clocked in the R-bit shift register 216 with a clock having (R+13) pulses per sample period. This effects a division by $2^{13}$. The maximum attenuation occurs when the control signal C4C3C2C1C0 is represented by the binary value 11111 which effects a coarse gain of $2^0$ times a fine gain of 38 divided by $2^{13}$ which is equal to 38×$2^{-13}$ or −46.67 dB. Incrementally changing the concatenated control signals from 00000 to 11111 effects an attenuation of 46.67 dB in steps of approximately 1.5 dB.

Figure 6:
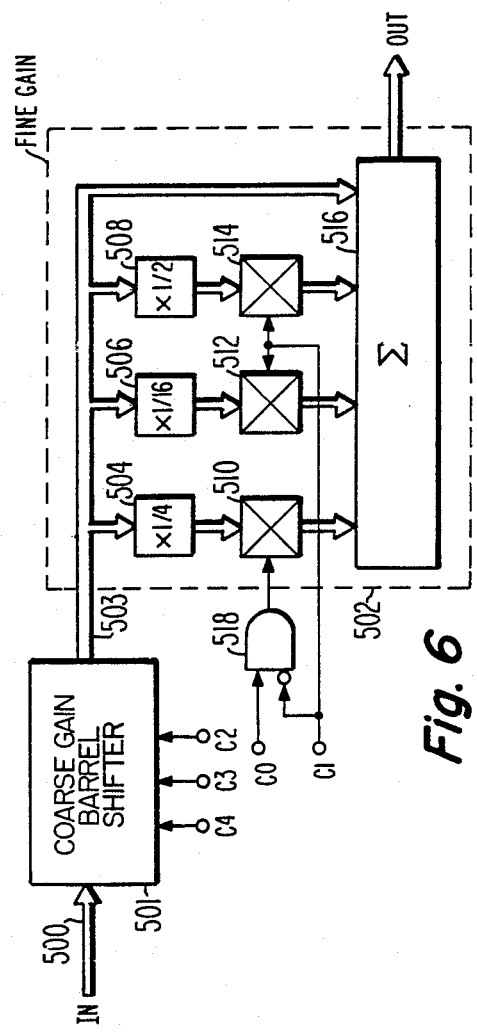
FIG. 6 is a block diagram of a parallel-bit digital volume control system embodying the invention.

FIG. 6 is a parallel-bit embodiment of a volume control system for altering gain/attenuation in approximately 2 dB steps. Parallel-bit samples are coupled via bus 500 to the parallel-bit coarse gain/attenuation block 501. Block 501 may be a conventional barrel shifter which shifts the bit significance of the sample bits to effect multiplication/division by powers of 2. Barrel shifter 501 is controlled by a 3-bit control signal C4C3C2 and may provide gain/attenuation equal to $2^N$ where N is an integer ranging from 0-7 (decimal). Block 501 therefore provides gain/attenuation in 6 dB steps.

The output of coarse gain block 501 is coupled to a fine gain block 502. Fine gain block 502 includes weighting circuits 508, 504 and 506 which scale the signal provided from the coarse gain block by factors of ½, ¼ and 1/16 respectively. Since the scale factors are reciprocal powers of 2, the weighting circuits may be simple hard-wired bit shift arrangements. The output samples from weighting circuits 508, 504 and 506 are respectively coupled to respective inputs of a parallel-bit summing circuit 516 by gating elements 514, 510 and 512. The output from the coarse gain block is also coupled to a respective input of summing circuit 516.

Gating elements 512 and 514 are controlled by control signal C1 and couple the respective weighted samples to summing circuit 516 when the control signal C1 is a logic high. Gating circuit 510 is controlled via AND gate 518 and couples weighted samples from the weighting circuit 504 to the summing circuit 516 only for the condition that control signal C0 is a logic high and control signal C1 a logic low.

When the control signal C1C0, formed by concatenating the control signals C1 and C0, is represented by the binary value 00, the only input sample coupled to the summing circuit 516 is the sample coupled directly from the coarse gain block. Consequently, the output sample from the summing circuit is equal to the input sample applied to the fine gain block, and the fine gain is 0 dB.

For the control signal C1C0 represented by the binary value 01, the input sample applied to the fine gain block and the input sample scaled by ¼ from weighting circuit 504 is coupled to the summing circuit 516. The output sample from the summing circuit is equal to 5/4 times the input sample which represents a gain of 1.94 dB.

Finally, for the control signal C1C0 represented by the binary values 10 and/or 11, the input samples applied to the fine gain block and the input samples scaled by 1/16 and ½ from weighting circuits 506 and 508 are coupled to the summing circuit 516. The output produced by the summing circuit is 25/16 times the input sample, providing a gain from the fine gain block of 3.88 dB representing a 1.94 dB gain step over the gain developed for the control signal C1C0 represented by the binary value 01. Fine gain block 502 thus provides two gain values in increments of approximately 2 dB.

The Control signals C4, C3, C2, C1, C0 for the FIG. 6 parallel bit embodiment, may be developed in the same manner as the control signals for the serial-bit embodiment illustrated in FIG. 2.

In the claims which follow and which relate to serial-bit processing elements, the terms adder/delay and subtracter/delay are defined as elements which combine signals or samples and provide a delay of a sample bit period to the combined signal or sample.

What is claimed is:

1. A digital signal amplitude control system for changing the amplitude value of a digital signal in substantially uniform dB steps, which steps are less than 6 dB, said system comprising:
a signal input terminal for applying said digital signal;
coarse control means, having a signal input terminal and having control signal input terminals and an output terminal, including means for altering the amplitude value of digital signals in multiples, including one, of 6 dB steps responsive to first control signals applied to said control signal input terminals;
fine control means, having a signal input terminal, an output terminal and control signal input terminals, including means for multiplying digital signals by a number of predetermined values responsive to second control signals applied to its control signal input terminals, wherein an ordered ascending/descending sequences of said predetermined values is substantially logarithmic;
means for coupling said coarse control means and said fine control means in a serial combination with said signal input terminal; and
control signal generating means, for generating said first and second control signals, wherein successive changes of said first and second control signals effect amplitude changes, in signal processed by said serial combination of coarse and fine control means, in substantially uniform increments of dB, which increments are less than 6 dB.

2. The system set forth in claim 1 wherein said predetermined values are P in number, P being an integer, and each successive predetermined value in an ordered sequence of said predetermined values is substantially $10^{6/(20P)}$ times the preceding predetermined value in said sequence.

3. A digital signal amplitude control system for changing the amplitude value of a digital signal in substantially uniform dB steps, which steps are less than 6 dB, said system comprising:
a signal input terminal for applying said digital signal;
coarse control means, having a signal input terminal and having control signal input terminals and an output terminal, including means for altering the amplitude value of digital signals in multiples, including one, of 6 dB steps responsive to first control signals applied to said control signal input terminals;
fine control means, having a signal input terminal, an output terminal and control signal input terminals, including means for multiplying digital signals by a predetermined number, P, of predetermined values responsive to second control signals applied to its control signal input terminals, P being an integer, and 20 times the logarithm (base 10) of the ratio of successive ones of an ordered ascending sequence of said predetermined values is a substantially equal to six divided by P; and
means for coupling said coarse control means and said fine control means in a serial combination with said signal input terminal;
control signal generating means, for generating said first and second control signals, wherein successive changes of said first and second control signals effect amplitude changes in signal processed by said serial combination in substantially uniform increments of dB, which increments are less than 6 dB.

4. The system set forth in claim 3 wherein said fine control means includes means for multiplying digital signals by four predetermined values and said predetermined values include one of the sequence 16, 19, 23, 27 and the sequence k16, k19, k23, k27, where k is a scaler constant.

5. The system set forth in claim 4 wherein said control signal generating means generates multibit binary values, the lesser significant bits of which are coupled to said fine control means as said second control signals and the more significant bits of which are coupled to said coarse control means as said first control signals, and includes means for incrementing said binary values in unit steps.

6. The system set forth in claim 3 wherein said fine control means includes means for multiplying digital signals by four predetermined values and said predetermined values include one of the sequence 16, 20, 25, and the sequence k16, k20, k25, where k is a scaler constant.

7. The system set forth in claim 6 wherein said control signal generating means generates multibit binary values, the lesser significant bits of which are coupled to said fine control means as said second control signals and the more significant bits of which are coupled to said coarse control means as said first control signals, and includes means for incrementing said binary values in unit steps.

8. A digital signal amplitude control system for changing the amplitude values of a serial-bit digital signal in substantially uniform dB steps, which steps are less than 6 dB and wherein said serial-bit digital signal occurs as PCM samples with LSB's occurring first in time, said system comprising:
- a signal input terminal for applying said serial-bit digital signal;
- a coarse multiplier/divider having signal input and output terminals, and having control input terminals for applying an N-state control signal (N being an integer), said coarse multiplier/divider responsive to said control signal for selectively delaying a serial-bit PCM signal by K sample bit periods, K being an integer from 0 to (N−1) inclusive;
- a fine multplier/divider having signal input and output terminals, and having control input terminals for applying an M-state control signal (M being an integer), including means responsive to said control signal for selectively combining signals applied to the signal input terminal of said fine multiplier/divider which are relatively delayed by integral sample bit periods to effect multiplication of serial-bit signals by predetermined values;
- means for connecting said fine and coarse multiplier/dividers in serial combination with said system signal input terminal; and
- control signal generating means, for generating said M-state and said N-state control signals wherein successive changes of said M-state and said N-state control signals effect amplitude changes in signal processed by said serial combination of said coarse and fine multiplier/divider in substantially uniform increments of dB, which increments are less than 6 dB.

9. The system set forth in claim 8 wherein said predetermined values are P in number, P being an integer, and 20 times the logarithm (base 10) of the ratio of successive ones of an ordered ascending sequence of said predetermined values is substantially equal to six divided by P.

10. The system set forth in claim 9 wherein said fine multiplier/divider comprises:
- a cascade connection of subtracter/delay elements and delay elements, having an output terminal and having an input terminal corresponding to the signal input terminal of said fine multiplier/divider, said subtracter delay elements have respective first input terminals connected in said cascade connection and have respective second input terminals; and
- gating means, having control input terminals corresponding to said control input terminals for applying an M-state control signal, including means for selectively coupling the input terminal of said cascade connection to ones of said second input terminals.

11. The system set forth in claim 10 wherein said cascade connection comprises, in order from input terminal to output terminal:
- a delay element;
- a first subtracter/delay element;
- a second subtracter/delay element;
- a further delay element; and
- a third subtracter/delay element.

12. The system set forth in claim 11 wherein said first, second and third subtracter/delay elements have respective minuend input terminals connected in the cascade connection and said delay element and further delay element provide delay periods in the ratio 2:1.

13. The system set forth in claim 9 wherein said fine multiplier/divider comprises:
- a cascade connection of adder/delay and delay elements, having an output terminal and having an input terminal corresponding to the signal input terminal of said fine multiplier/divider, and wherein said adder/delay elements have respective first input terminals connected in said cascade connection and have respective second input terminals;
- gating means having control input terminals corresponding to said control input terminals for applying an M-state control signal, said gating means for selectively coupling the input terminal of said cascade connection to respective ones of said second input terminals.

14. The system set forth in claim 13 wherein said cascade connection comprises, in order from input terminal to output terminal,
- a delay element,
- an adder/delay element
- a further adder/delay element
- a further delay element
- a subtracter/delay element, said subtracter/delay element having a minuend input terminal connected in cascade and having a subtrahend input terminal;
- and wherein said fine multiplier/divider includes further gating means responsive to said M-state control signals for selectively coupling said subtrahend input terminal to the input terminal of said cascade connection.

15. The system set forth in claim 14 wherein said control signal generating means includes an up/down counter for developing binary output signals having LSB's coupled to said control input terminals for applying an M-state control signal, and having more significant bits coupled to said control input terminals for applying an N-state control signal.

16. The system set forth in claim 8 wherein said fine multiplier/divider comprises:
- a cascade connection of adder/delay and delay elements, having an output terminal and having an input terminal corresponding to the signal input terminal of said fine multiplier/divider, and wherein said adder/delay elements have respective first input terminals connected in said cascade connection and have respective second input terminals;

gating means having control input terminals corresponding to said control input terminals for applying an M-state control signal, said gating means including means for selectively coupling the input terminal of said cascade connection to respective ones of said second input terminals.

17. The system set forth in claim 16 wherein said cascade connection comprises, in order from input terminal to output terminal,
   a delay element,
   an adder/delay element
   a further adder/delay element
   a further delay element
   a subtracter/delay element, said subtracter/delay element having a minuend input terminal connected in cascade and having a subtrahend input terminal;
and wherein said fine multiplier/divider includes further gating means responsive to said M-state control signals for selectively coupling said subtrahend input terminal to the input terminal of said cascade connection.

* * * * *